(12) United States Patent
Ryu et al.

(10) Patent No.: US 12,114,527 B2
(45) Date of Patent: Oct. 8, 2024

(54) DISPLAY DEVICE AND METHOD OF MANUFACTURING THE SAME

(71) Applicant: Samsung Display Co., LTD., Yongin-si (KR)

(72) Inventors: Min Yeul Ryu, Suwon-si (KR); Dong Ki Lee, Seongnam-si (KR); Jun Hee Lee, Hwaseong-si (KR); Choong Youl Im, Yongin-si (KR); Beohm Rock Choi, Seoul (KR); Nak Cho Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 387 days.

(21) Appl. No.: 17/507,757

(22) Filed: Oct. 21, 2021

(65) Prior Publication Data
US 2022/0131114 A1  Apr. 28, 2022

(30) Foreign Application Priority Data

Oct. 22, 2020 (KR) .......................... 10-2020-0137592

(51) Int. Cl.
*H01L 27/12* (2006.01)
*H01L 29/786* (2006.01)
(Continued)

(52) U.S. Cl.
CPC ..... *H10K 50/865* (2023.02); *H01L 29/78651* (2013.01); *H01L 29/7869* (2013.01);
(Continued)

(58) Field of Classification Search
CPC ... H01L 27/1225; H01L 27/12; H01L 27/124; H01L 29/78651; H01L 29/786;
(Continued)

(56) References Cited

U.S. PATENT DOCUMENTS 9,989,824 B2 * 6/2018 Cao .................. G02F 1/136286
11,758,779 B2 * 9/2023 Jo .......................... H10K 71/00
257/40

(Continued)

FOREIGN PATENT DOCUMENTS

KR        100886802        3/2009

*Primary Examiner* — Nikolay K Yushin
(74) *Attorney, Agent, or Firm* — CANTOR COLBURN LLP

(57) ABSTRACT

A display device includes a substrate, a first insulating layer on the substrate and including a flat upper surface, a first conductive layer on the substrate, the first conductive layer including first to third light blocking patterns separated from one another, a second insulating layer on the first conductive layer, and pixel electrodes on the second insulating layer. The pixel electrodes includes a first pixel electrode in a first color pixel and in the first light blocking pattern in a first direction in a plan view, and a second pixel electrode in a second color pixel and covering the second and third light blocking patterns in the first direction, the second insulating layer includes first and second areas respectively overlapping the first and second pixel electrodes, and each of the upper surfaces of the first and second areas includes a curved surface with a concave central portion.

20 Claims, 14 Drawing Sheets

(51) Int. Cl.
*H10K 50/86* (2023.01)
*H10K 59/131* (2023.01)
*H10K 59/35* (2023.01)
*H10K 71/00* (2023.01)

(52) U.S. Cl.
CPC ......... *H10K 59/131* (2023.02); *H10K 59/353* (2023.02); *H10K 71/00* (2023.02)

(58) Field of Classification Search
CPC ........... H01L 29/7869; H01L 29/78633; H01L 23/52; H01L 23/53247; H01L 23/481; H10K 50/865; H10K 50/86; H10K 50/813; H10K 59/131; H10K 59/353; H10K 59/35; H10K 59/121; H10K 59/126; H10K 59/12; H10K 59/1201; H10K 59/124; H10K 71/00; H10K 71/10; H10K 71/166; H10K 71/30; H10K 71/233; H10K 71/851
See application file for complete search history.

(56) References Cited

U.S. PATENT DOCUMENTS

| | | | |
|---|---|---|---|
| 2017/0176825 A1* | 6/2017 | Cao | G02F 1/134309 |
| 2020/0075636 A1 | 3/2020 | Gupta et al. | |
| 2021/0202674 A1* | 7/2021 | Jo | H10K 59/124 |

* cited by examiner

DISPLAY DEVICE AND METHOD OF MANUFACTURING THE SAME

This application claims priority to Korean Patent Application No. 10-2020-0137592, filed on Oct. 22, 2020, and all the benefits accruing therefrom under 35 U.S.C. § 119, the content of which in its entirety is herein incorporated by reference.

BACKGROUND

1. Field

Embodiments of the invention relate to a display device and a method of manufacturing the display device.

2. Description of the Related Art

An importance of a display device is being increased with a development of multimedia. Accordingly, various types of display devices such as an organic light emitting display ("OLED") and a liquid crystal display ("LCD'"") are being used. Examples of application of such display devices are diversified, based on various mobile electronic devices, for example, portable electronic devices such as smart phones, smart watches, and tablet personal computers ("PCs").

In some cases, external light may be introduced to a display surface of the display device. The external light introduced from the outside may be reflected by some of a plurality of conductive layers included in the display device.

SUMMARY

Features of the invention are to provide a display device including a sub-pixel electrode having the same upper surface shape for each pixel to exhibit the same optical properties for each sub-pixel with respect to external light introduced from the outside, and a method of manufacturing the display device.

However, features of the invention are not restricted to the one set forth herein. The above and other features of the invention will become more apparent to one of ordinary skill in the art to which the invention pertains by referencing the detailed description of the invention given below.

An embodiment of a display device includes a substrate, a first insulating layer disposed on the substrate and including a first surface facing the substrate and a second surface which is opposite to the first surface and flat, a first conductive layer disposed on the substrate, the first conductive layer including a first light blocking pattern, a second light blocking pattern, and a third light blocking pattern which are separated from each other, a second insulating layer disposed on the first conductive layer and including first and second areas each including a first surface which faces the substrate and a second surface which is opposite to the first surface, and a plurality of pixel electrodes disposed on the second insulating layer, where the plurality of pixel electrodes includes a first pixel electrode which is disposed in a first color pixel and disposed in the first light blocking pattern in a first direction in a plan view, and a second pixel electrode which is disposed in a second color pixel and covers the second light blocking pattern and the third light blocking pattern in the first direction, the second insulating layer includes a first area overlapping with the first pixel electrode and a second area overlapping with the second pixel electrode, and each of the second surface of the first area and the second surface of the second area of the second insulating layer includes a curved surface with a concave central portion.

An embodiment of a method of manufacturing a display device includes forming a first conductive layer including a first light blocking pattern, a second light blocking pattern, and a third light blocking pattern which are separated from each other, on a substrate, coating an insulating-material layer on the first conductive layer, disposing a mask including a light transmitting area, a light blocking area, and a semi-light blocking area on the insulating-material layer, and irradiating light onto the insulating-material layer through the mask, developing the insulating-material layer to form an insulating pattern including a trench, defining a groove in an insulating layer by heat-treating the insulating pattern, and forming a pixel electrode on the groove of the insulating layer, where a width of the groove is greater than a width of the trench.

BRIEF DESCRIPTION OF THE DRAWINGS

The above and other features and features of the invention will become more apparent by describing in detail embodiments thereof with reference to the attached drawings, in which.

DETAILED DESCRIPTION

Figure 1:
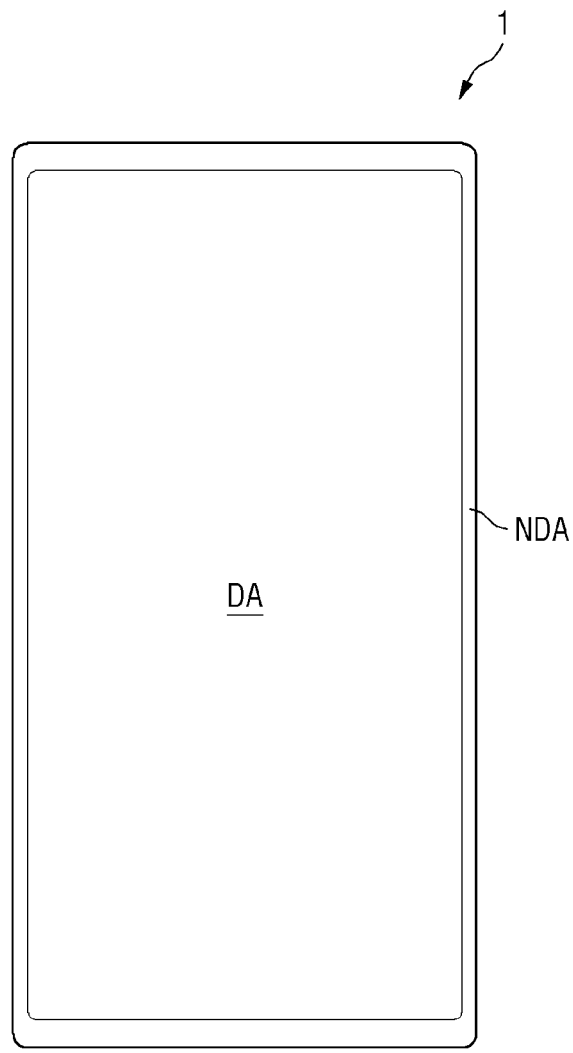
FIG. 1 is a plan view of an embodiment of a display device.

Embodiments of the invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this invention will be thorough and complete, and will fully convey the scope of the invention to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. For example, if the device in the drawing figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims The same reference numbers indicate the same components throughout the specification.

Hereinafter, embodiments of the invention will be described with reference to the attached drawings.

Figure 2:
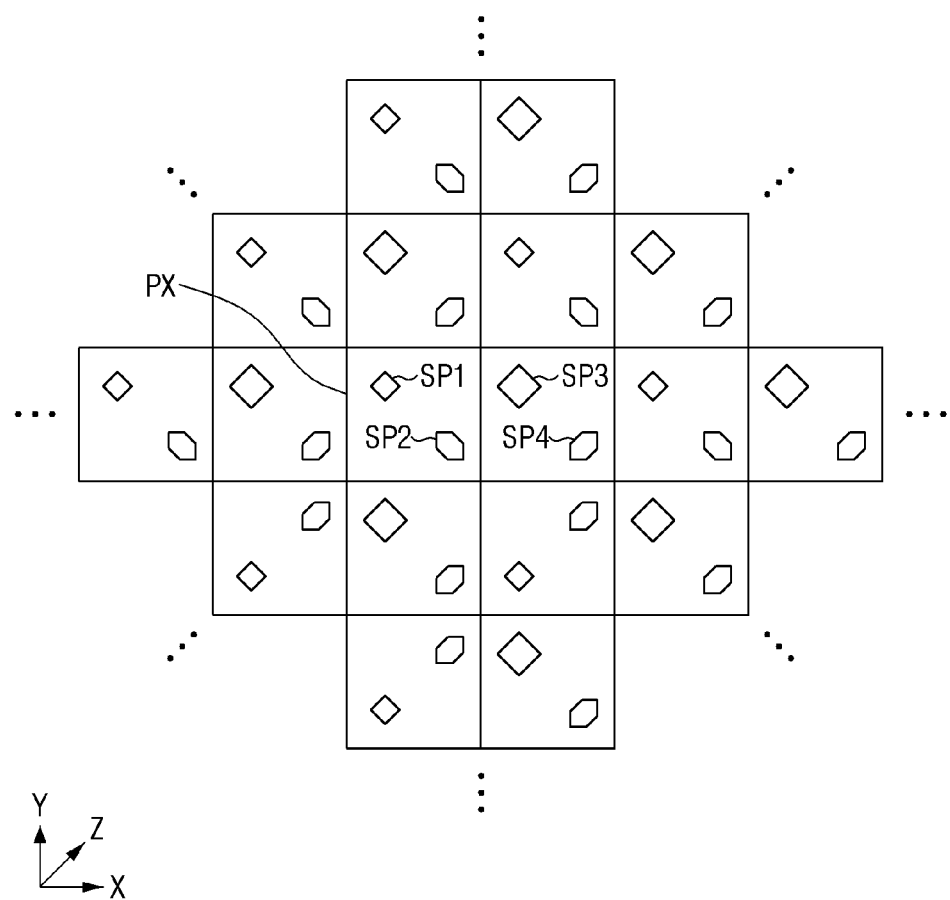
FIG. 2 is a schematic view of an embodiment of a pixel array of the display device.

FIG. 1 is a plan view of an embodiment of a display device. FIG. 2 is a schematic view of an embodiment of a pixel array of the display device.

Referring to FIGS. 1 and 2, a display device 1 displays a mobile image or a still image. The display device 1 may refer to any electronic device that provides a display screen. Examples of the display device 1 may include televisions, notebook computers, monitors, billboards, things of internet ("IoTs"), mobile phones, smart phones, tablet personal computers (tablet "PCs"), electronic watches, smart watches, watch phones, head mount displays, mobile communication terminals, electronic notebooks, electronic books, portable multimedia players ("PMPs"), navigators, game machines, digital cameras, and camcorders.

The display device 1 includes a display panel for providing a display screen. Examples of the display panel may include an inorganic light emitting diode display panel, an organic light emitting display panel, a quantum dot light emitting display panel, a plasma display panel, and a field emission display panel. Hereinafter, a case where an inorganic light emitting diode display panel is used as the display panel will be described as an example, but the invention is not limited thereto. Other display panels may be applied as long as the same technical spirit is applicable.

The shape of the display device 1 may be variously modified. In an embodiment, the display device 1 may have shapes such as a widthwise rectangle, a lengthwise rectangle, a square, a rectangle with round corners (vertexes), other polygons, and circles, for example. The shape of a display area DA of the display device 1 may also be similar to the overall shape of the display device 1. In FIG. 1, a display device 1 having a lengthwise rectangular shape and a display area DA are illustrated.

The display device 1 may include the display area DA and a non-display area NDA. The display area DA is an area in which a screen may be displayed, and the non-display area NDA is an area in which the screen is not displayed. The display area DA may be also referred to as an active area, and the non-display area NDA may be also referred to as an inactive area. The display area DA may generally occupy the center of the display device 1.

The display area DA may include a plurality of pixels PX. The plurality of pixels PX may be arranged in a first direction X and a third direction Z. The first direction X may be a horizontal direction in the plan view, a second direction Y may be a vertical direction in the plan view, and the third direction Z may be an inclined planar direction between the first direction X and the second direction Y.

Each pixel PX may include a plurality of sub-pixels SP arranged in a pentile type. In an embodiment, each pixel PX may include a first sub-pixel SP1, a second sub-pixel SP2 disposed at a lower right side of the first sub-pixel SP1 in the plan view, a third sub-pixel SP3 disposed at an upper right side of the second sub-pixel SP2, and a fourth sub-pixel SP4 disposed at a lower right side of the third sub-pixel SP3 in the plan view, for example.

The first to fourth sub-pixels SP1, SP2, SP3, and SP4 may include light emitting elements that emit light having different wavelengths. In an embodiment, the first sub-pixel SP1 includes a light emitting element that emits red light, the second and fourth sub-pixels SP2 and SP4 include light emitting elements that emit green light, and the third sub-pixel SP3 may include a light emitting element that emits blue light, for example.

The first to fourth sub-pixels SP1, SP2, SP3, and SP4 may include emission areas having different shapes and different areas. The emission area may mean an area in which light generated by the light emitting element of each of the sub-pixels SP1, SP2, SP3, and SP4 is emitted. In an embodiment, the third sub-pixel SP3 may have an emission area having a larger area than those of the first, second, and fourth sub-pixels SP1, SP2, and SP4, and the first sub-pixel SP1 may have an emission area having a larger area than those of the second and fourth sub-pixels SP2 and SP4, and the second and fourth sub-pixels SP2 and SP4 may have emission areas having substantially the same area, for example. Further, the first and third sub-pixels SP1 and SP3 may have a rhombus-shaped emission area, and the second and fourth sub-pixels SP2 and SP4 may have a hexagonal emission area.

The non-display area NDA may be disposed around the display area DA. The non-display area NDA may entirely or partially surround the display area DA. The display area DA has a quadrangular (e.g., rectangular) shape, and the non-display area NDA may be disposed to be adjacent to four sides of the display area DA. The non-display area NDA may configure a bezel of the display device 1. In respective non-display areas NDA, wires or circuit drivers included in the display device 1 may be disposed, or external devices may be disposed (e.g., mounted).

Figure 3:
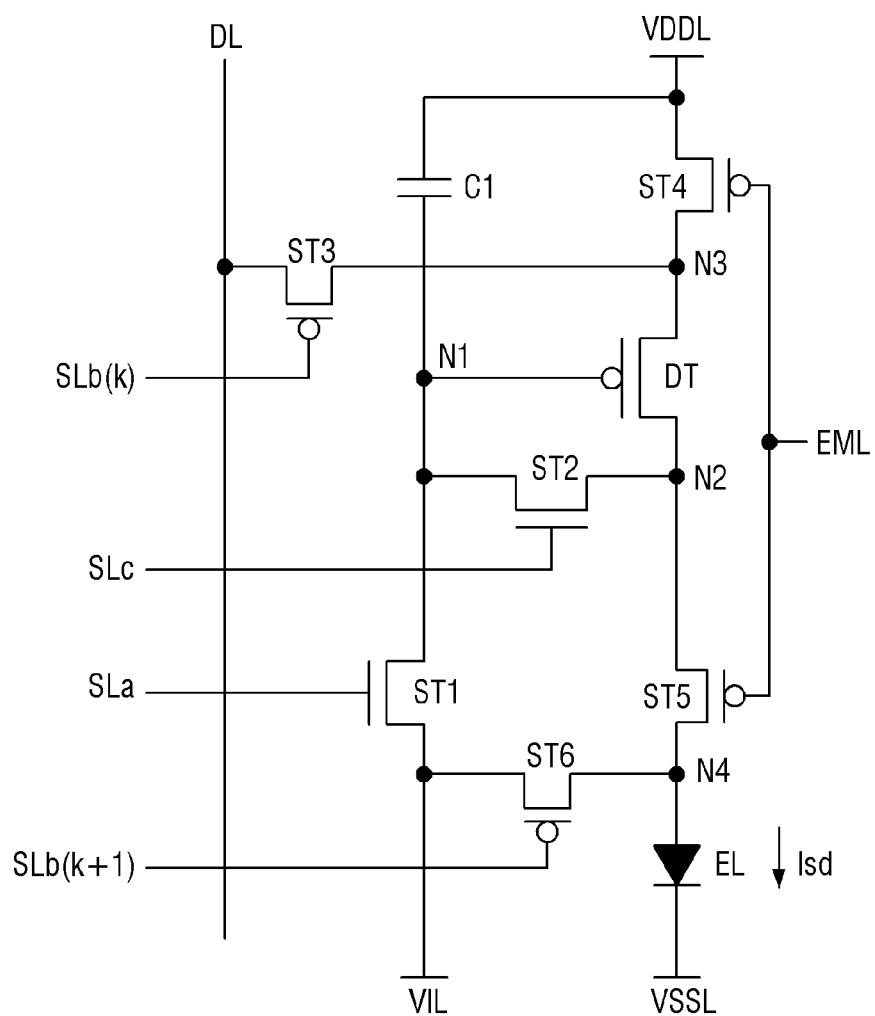
FIG. 3 is an equivalent circuit view of an embodiment of a sub-pixel of the display device.

FIG. 3 is an equivalent circuit view of an embodiment of a sub-pixel of the display device.

The display device 1 may include a plurality of sub-pixels SP arranged along k-th rows (k is a natural number) and j columns (j is a natural number). Each sub-pixel SP may be connected to a first scan line SLa, a second scan line SLb, a third scan line SLc, an emission control line EML, a data line DL, a driving voltage line VDDL, and an initialization voltage line VIL.

Each sub-pixel SP may include a driving transistor DT, a light emitting element EL, a plurality of switching devices, and a first capacitor C1. The plurality of switching elements may include first to sixth transistors ST1, ST2, ST3, ST4, ST5, and ST6.

The driving transistor DT may include a gate electrode, a first electrode and a second electrode. The gate electrode of the driving transistor DT may be connected to a first node N1, the second electrode may be connected to a second node N2, and the first electrode may be connected to a third node N3. The driving transistor DT may control a source-drain current Isd (hereinafter also referred to as a "driving current") according to a data voltage applied to the gate electrode. The driving current Isd flowing through a channel of the driving transistor DT may be proportional to the square of a difference between a voltage Vsg between the first electrode and the gate electrode of the driving transistor DT and a threshold voltage Vth ($Isd=k'\times(Vsg-Vth)^2$). Here, k' denotes a proportional coefficient determined by the structure and physical properties of the driving transistor DT, Vsg denotes a source-gate voltage of the driving transistor DT, and Vth denotes a threshold voltage of the driving transistor DT.

The light emitting element EL may emit light by receiving the driving current Isd. The emission amount or luminance of the light emitting element EL may be proportional to the magnitude of the driving current Isd.

The light emitting element EL may be an organic light emitting diode including an anode electrode, a cathode electrode, and an organic light emitting layer disposed between the anode electrode and the cathode electrode.

The anode electrode of the light emitting element EL may be connected to a fourth node N4. The anode electrode of the light emitting element EL may be connected to the second electrode of the fifth transistor ST5 and the second electrode of the sixth transistor ST6 through the fourth node N4. The cathode electrode of the light emitting element EL may be connected to a low potential line VSSL. A parasitic capacitance may be generated between the anode electrode and the cathode electrode of the light emitting element EL.

The first transistor ST1 may be turned on by a scan signal of the first scan line SLa to connect the initialization voltage line VIL and the first node N1 which is the gate electrode of the driving transistor DT. The first transistor ST1 is turned on based on a scan signal of the first scan line SLa to discharge the gate electrode of the driving transistor DT to the initialization voltage. The gate electrode of the first transistor ST1 may be connected to the first scan line SLa, the second electrode may be connected to the initialization voltage line VIL, and the first electrode may be connected to the first node N1. The first electrode of the first transistor ST1 may be connected to the gate electrode of the driving transistor DT, the first electrode of the second transistor ST2, and the first electrode of the first capacitor C1 through the first node N1.

The second transistor ST2 may be turned on by a scan signal of the third scan line SLc to connect the second node N2 as the second electrode of the driving transistor DT and the first node N1 as the gate electrode of the driving transistor DT. The gate electrode of the second transistor ST2 may be connected to the third scan line SLc, the second electrode may be connected to the second node N2, and the first electrode may be connected to the first node N1. The second electrode of the second transistor ST2 may be connected to the second electrode of the driving transistor DT and the first electrode of the fifth transistor ST5 through the second node N2. The first electrode of the second transistor ST2 may be connected to the gate electrode of the driving transistor DT, the first electrode of the first transistor ST1 and the first electrode of the first capacitor C1 through the first node N1.

The third transistor ST3 may be turned on by a scan signal of the second scan line SLb(k) to connect the data line DL and the third node N3, which is the first electrode of the driving transistor DT. Here, the second scan line SLb(k) may be connected to a sub-pixel SP arranged in the k-th row of the display device 1. The third transistor ST3 may be turned on based on the scan signal of the second scan line SLb(k) to supply the data voltage to the third node N3. The gate electrode of the third transistor ST3 may be connected to the second scan line SLb(k), the first electrode may be connected to the data line DL, and the second electrode may be connected to the third node N3. The second electrode of the third transistor ST3 may be connected to the first electrode of the driving transistor DT and the second electrode of the fourth transistor ST4 through the third node N3.

The fourth transistor ST4 may be turned on by an emission signal of the emission control line EML to connect the driving voltage line VDDL and the third node N3 which is the first electrode of the driving transistor DT. The gate electrode of the fourth transistor ST4 may be connected to the emission control line EML, the first electrode may be connected to the driving voltage line VDDL, and the second electrode may be connected to the third node N3. The second electrode of the fourth transistor ST4 may be connected to the first electrode of the driving transistor DT and the second electrode of the third transistor ST3 through the third node N3.

The fifth transistor ST5 may be turned on by the emission signal of the light emission control line EML to connect the second node N2, which is the second electrode of the driving transistor DT, and the fourth node N4, which is the anode electrode of the light emitting element EL. The gate electrode of the fifth transistor ST5 may be connected to the emission control line EML, the first electrode may be connected to the second node N2, and the second electrode may be connected to the fourth node N4. The first electrode of the fifth transistor ST5 may be connected to the second electrode of the driving transistor DT and the second electrode of the second transistor ST2 through the second node N2. The second electrode of the fifth transistor ST5 may be connected to the anode electrode of the light emitting element EL and the second electrode of the sixth transistor ST6 through the fourth node N4.

When all of the fourth transistor ST4, the driving transistor DT, and the fifth transistor ST5 are turned on, the driving current Isd may be supplied to the light emitting element EL.

The sixth transistor ST6 may be turned on by a scan signal of a second scan line SLb(k+1) to connect the initialization voltage line VIL and the fourth node N4 which is the anode electrode of the light emitting element EL. Here, the second scan line SLb(k+1) may be connected to a sub-pixel SP arranged in a (k+1)th row of the display device 1. The sixth transistor ST6 is turned on based on the scan signal of the second scan line SLb(k+1) to discharge the anode electrode of the light emitting element EL to the initialization voltage. The gate electrode of the sixth transistor ST6 may be connected to the second scan line SLb(k+1), the first electrode may be connected to the initialization voltage line VIL, and the second electrode may be connected to the fourth node N4. The second electrode of the sixth transistor ST6 may be connected to the anode electrode of the light emitting element EL and the second electrode of the fifth transistor ST5 through the fourth node N4.

Each of the driving transistor DT and the third to sixth transistors ST3, ST4, ST5, and ST6 may include a silicon-based active layer. In an embodiment, each of the driving transistor DT and the third to sixth transistors ST3, ST4, ST5, and ST6 may include an active layer including low temperature polycrystalline silicon ("LTPS"), for example. The active layer including the LTPS may have high electron mobility and an excellent turn-on property. Accordingly, the display device 1 includes the driving transistor DT and the third to sixth transistors ST3, ST4, ST5, and ST6 having the excellent turn-on property, thereby stably and efficiently providing a plurality of sub-pixels SP.

Each of the driving transistor DT and the third to sixth transistors ST3, ST4, ST5, and ST6 may correspond to a p-type transistor. In an embodiment, each of the driving transistor DT and the third to sixth transistors ST3, ST4, ST5, and ST6 may output a current flowing into the first electrode to the second electrode based on a gate low voltage applied to the gate electrode, for example.

Each of the first and second transistors ST1 and ST2 may include an oxide-based active layer. In an embodiment, each of the first and second transistors ST1 and ST2 may have a coplanar structure in which a gate electrode is disposed on the oxide-based active layer, for example. The transistor having the coplanar structure has an excellent off-current property and enables low-frequency driving, thereby reducing power consumption. Accordingly, the display device 1 includes the first and second transistors ST1 and ST2 having the excellent off-current property, thereby preventing the off-current from flowing inside the sub-pixel SP and stably maintaining the voltage inside the sub-pixel SP.

Each of the first and second transistors ST1 and ST2 may correspond to an n-type active layer. In an embodiment, each of the first and second transistors ST1 and ST2 may output a current flowing into the second electrode to the first electrode based on a gate high voltage applied to the gate electrode, for example.

The first capacitor C1 may be connected between the first node N1 as the gate electrode of the driving transistor DT and the driving voltage line VDDL. In an embodiment, the first electrode of the first capacitor C1 is connected to the first node N1, and the second electrode of the first capacitor C1 is connected to the driving voltage line VDDL, thereby maintaining a potential difference between the driving voltage line VDDL and the gate electrode of the driving transistor DT, for example.

When the first electrode of each of the first to sixth transistors ST1, ST2, ST3, ST4, ST5, and ST6, and the driving transistor DT is a source electrode, the second electrode may be a drain electrode. In an alternative embodiment, when the first electrode of each of the first to sixth transistors ST1, ST2, ST3, ST4, ST5, and ST6, and the driving transistor DT is a drain electrode, the second electrode may be a source electrode.

Figure 4:
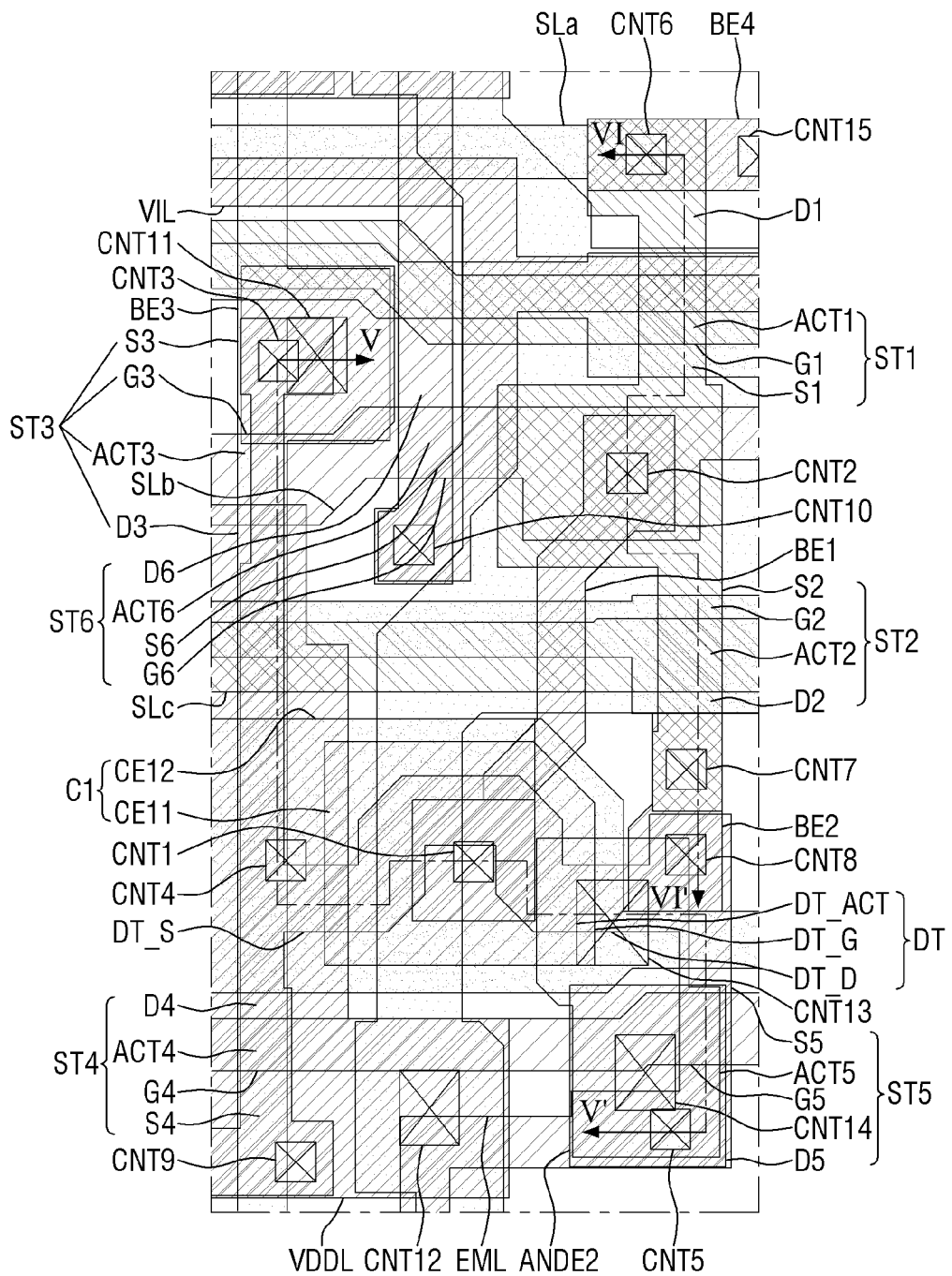
FIG. 4 is a plan view illustrating an embodiment of a sub-pixel driver.

FIG. 4 is a plan view illustrating an embodiment of a sub-pixel driver. In an embodiment, FIG. 4 may correspond to a drawing in which a first active layer, a first gate layer, a second gate layer, a second active layer, a third gate layer, a first source-drain layer, and a second source-drain layer are sequentially stacked, for example. The stacking relationship between the respective layers of FIG. 4 will be described below with reference to FIGS. 5 and 6.

Referring to FIG. 4, each sub-pixel SP may include a driving transistor DT, a light emitting element EL, first to sixth transistors ST1, ST2, ST3, ST4, STS, ST6, and a first capacitor C1.

Figure 5:
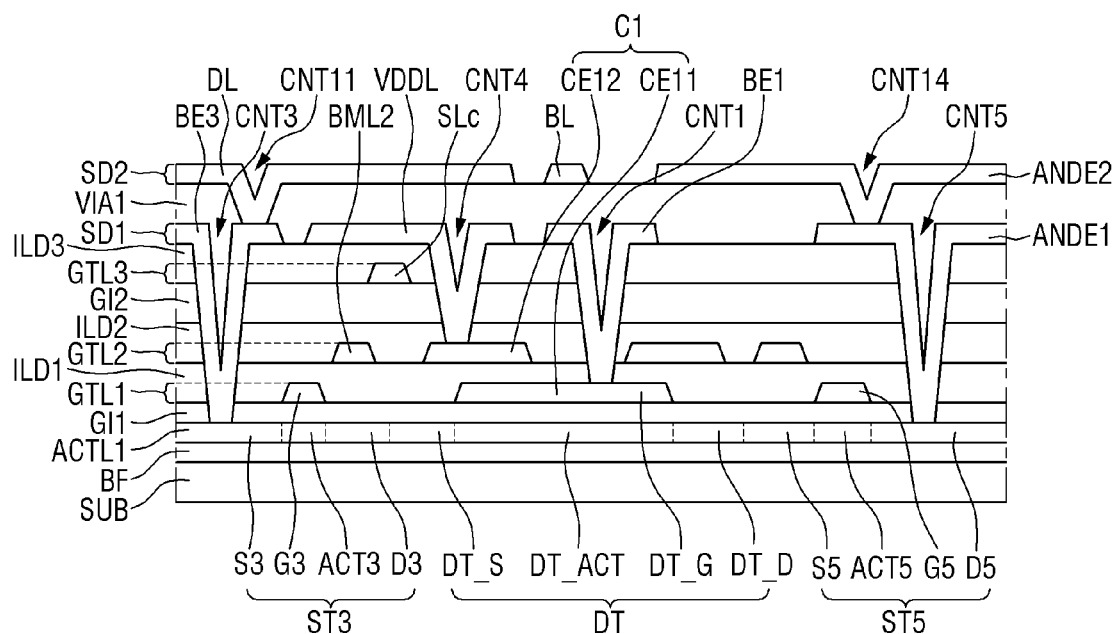
FIG. 5 is a cross-sectional view taken along line V-V' of FIG. 4.
Figure 6:
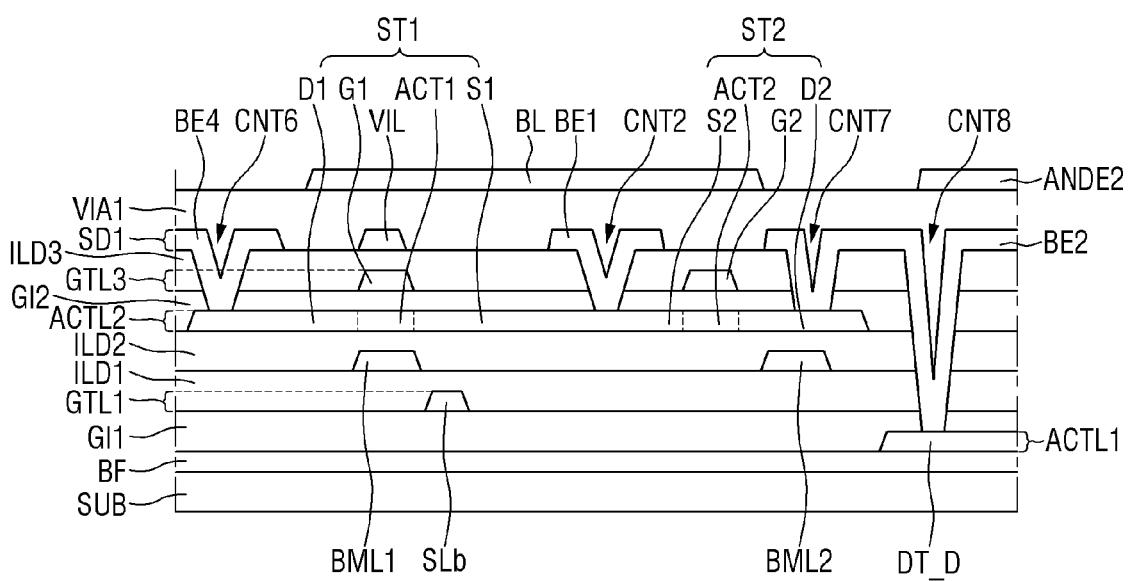
FIG. 6 is a cross-sectional view taken along line IV-IV' of FIG. 4.

Referring to FIGS. 4 to 6, the driving transistor DT may include an active area DT_ACT, a gate electrode DT_G, a first electrode DT_S, and a second electrode DT_D. The active area DT_ACT of the driving transistor DT may be disposed in the first active layer ACTL1 and may overlap with the gate electrode DT_G of the driving transistor DT. In an embodiment, the first active layer ACTL1 may include LTPS, for example.

The gate electrode DT_G of the driving transistor DT may be connected to a first connection electrode BE1 through a first contact hole CNT1, and the first connection electrode BE1 may be connected to the second active layer ACTL2 through a second contact hole CNT2. In an embodiment, the second active layer ACTL2 may include an oxide-based material, for example. The first connection electrode BE1 may be connected to a first electrode S1 of the first transistor ST1 and a first electrode S2 of the second transistor ST2. Further, an area of the gate electrode DT_G of the driving transistor DT that overlaps with the second gate layer GTL2 may correspond to a first electrode CE11 of the first capacitor C1.

The first electrode DT_S of the driving transistor DT may be connected to a second electrode D3 of the third transistor ST3 and a second electrode D4 of the fourth transistor ST4.

The second electrode DT_D of the driving transistor DT may be connected to a second connection electrode BE2 through an eighth contact hole CNT8, and the second connection electrode BE2 may be connected to an second electrode D2 of the second transistor ST2 through a seventh contact hole CNT7. Further, the second electrode DT_D of the driving transistor DT may be connected to a first electrode S5 of the fifth transistor ST5.

The first transistor ST1 may include an active area ACT1, a gate electrode G1, a second electrode D1, and a first electrode S1. The active area ACT1 of the first transistor ST1 may overlap with the gate electrode G1 of the first transistor ST1. In an embodiment, the active area ACT1 of the first transistor ST1 may include an oxide-based active layer, for example. The gate electrode G1 of the first transistor ST1 is a part of the first scan line SLa and may correspond to an area of the first scan line SLa overlapping with the active area ACT1.

The second electrode D1 of the first transistor ST1 may be connected to the initialization voltage line VIL through a sixth contact hole CNT6 to receive the initialization voltage.

The first electrode S1 of the first transistor ST1 may be connected to the first electrode S2 of the second transistor ST2. In addition, the first electrode S1 of the first transistor ST1 may be connected to the first connection electrode BE1 through the second contact hole CNT2, and the first connection electrode BE1 may be connected to the gate electrode DT_G of the driving transistor DT or the first electrode CE11 of the first capacitor C1 through the first contact hole CNT1.

The second transistor ST2 may include an active area ACT2, a gate electrode G2, a first electrode S2, and a second electrode D2. The active area ACT2 of the second transistor ST2 may overlap with the gate electrode G2 of the second transistor ST2. In an embodiment, the active area ACT2 of the second transistor ST2 may include an oxide-based active layer, for example. The gate electrode G2 of the second transistor ST2 is a part of the third scan line SLc and may correspond to an area of the third scan line SLc overlapping with the active area ACT2.

The second electrode D2 of the second transistor ST2 may be connected to the second connection electrode BE2 through the seventh contact hole CNT7, and the second connection electrode BE2 may be connected to the second electrode DT_D of the driving transistor DT and the first electrode S5 of the fifth transistor ST5 through the eighth contact hole CNT8.

The first electrode S2 of the second transistor ST2 may be connected to the first electrode S1 of the first transistor ST1. In addition, the first electrode S2 of the second transistor ST2 may be connected to the first connection electrode BE1 through the second contact hole CNT2, and the first connection electrode BE1 may be connected to the gate electrode DT_G of the driving transistor DT or the first electrode CE11 of the first capacitor C1 through the first contact hole CNT1.

The third transistor ST3 may include an active area ACT3, a gate electrode G3, a first electrode S3, and a second electrode D3. The active area ACT3 of the third transistor ST3 may overlap with the gate electrode G3 of the third transistor ST3. In an embodiment, the active area ACT3 of the third transistor ST3 may include LTPS, for example. The gate electrode G3 of the third transistor ST3 is a part of a second scan line SLb and may correspond to an area of the second scan line SLb overlapping with the active area ACT3.

The first electrode S3 of the third transistor ST3 may be connected to a third connection electrode BE3 through a third contact hole CNT3, and the third connection electrode BE3 may be connected to a data line DL. Accordingly, the first electrode S3 of the third transistor ST3 may receive a data voltage from the data line DL.

The second electrode D3 of the third transistor ST3 may be connected to the first electrode DT_S of the driving transistor DT and the second electrode D4 of the fourth transistor ST4.

The fourth transistor ST4 may include an active area ACT4, a gate electrode G4, a first electrode S4, and a second electrode D4. The active area ACT4 of the fourth transistor ST4 may overlap with the gate electrode G4 of the fourth transistor ST4. In an embodiment, the active area ACT4 of the fourth transistor ST4 may include LTPS, for example. The gate electrode G4 of the fourth transistor ST4 is a part of the emission control line EML, and may correspond to an area overlapping with the active area ACT4 of the emission control line EML.

The first electrode S4 of the fourth transistor ST4 may be connected to a driving voltage line VDDL through a ninth contact hole CNT9. Accordingly, the first electrode S4 of the fourth transistor ST4 may receive a driving voltage from the driving voltage line VDDL.

The second electrode D4 of the fourth transistor ST4 may be connected to the first electrode DT_S of the driving transistor DT and the second electrode D3 of the third transistor ST3.

The fifth transistor ST5 may include an active area ACT5, a gate electrode G5, a first electrode S5, and a second electrode D5. The active area ACT5 of the fifth transistor ST5 may overlap with the gate electrode G5 of the fifth transistor ST5. In an embodiment, the active area ACT5 of the fifth transistor ST5 may include LTPS, for example. The gate electrode G5 of the fifth transistor ST5 is a part of the emission control line EML, and may correspond to an area overlapping with the active area ACT5 of the emission control line EML.

Further, the first electrode S5 of the fifth transistor ST5 may be connected to the second electrode DT_D of the driving transistor DT. Further, the first electrode S5 of the fifth transistor ST5 may be connected to the second connection electrode BE2 through the eighth contact hole CNT8, and the second connection electrode BE2 may be connected to the second electrode D2 of the second transistor ST2 through the seventh contact hole CNT7.

The second electrode D5 of the fifth transistor ST5 may be connected to a first anode connection electrode ANDE1 through the fifth contact hole CNT5. The first anode connection electrode ANDE1 may be connected to a second anode connection electrode ANDE2 through a fourteenth contact hole CNT14, and the second anode connection electrode ANDE2 may be connected to the anode electrode of the light emitting element EL.

The sixth transistor ST6 may include an active area ACT6, a gate electrode G6, a second electrode D6, and a first electrode S6. The active area ACT6 of the sixth transistor ST6 may overlap with the gate electrode G6 of the sixth transistor ST6. In an embodiment, the active area ACT6 of the sixth transistor ST6 may include LTPS, for example. The gate electrode G6 of the sixth transistor ST6 is a part of the second scan line SLb, and may correspond to an area of the second scan line SLb overlapping with the active area ACT6.

The first electrode S6 of the sixth transistor ST6 may be connected to the initialization voltage line VIL through a tenth contact hole CNT10 to receive the initialization voltage.

The second electrode D6 of the sixth transistor ST6 may be connected to the first anode connection electrode ANDE1 through the fifth contact hole CNT5. The first anode connection electrode ANDE1 may be connected to a second anode connection electrode ANDE2 through the fourteenth contact hole CNT14, and the second anode connection electrode ANDE2 may be connected to the anode electrode of the light emitting element EL.

The first capacitor C1 may include a first electrode CE11 and a second electrode CE12. The first electrode CE11 of the first capacitor C1 is a part of the gate electrode DT_G of the driving transistor DT, and may correspond to an area of the gate electrodes DT_G of the driving transistor DT overlapping with the second gate layer GTL2. The first electrode CE11 of the first capacitor C1 may be connected to the first connection electrode BE1 through the first contact hole CNT1, and the first connection electrode BE1 may be connected to the first electrode S1 of the first transistor ST1 and the first electrode S2 of the second transistor ST2 through the second contact hole CNT2.

The second electrode CE12 of the first capacitor C1 may be connected to the driving voltage line VDDL through the fourth contact hole CNT4. Accordingly, the second electrode CE12 of the first capacitor C1 may receive a driving voltage from the driving voltage line VDDL.

FIG. 5 is a cross-sectional view taken along line V-V' of FIG. 4. FIG. 6 is a cross-sectional view taken along line IV-IV' of FIG. 4.

Referring to FIGS. 5 and 6 in connection with FIG. 4, the display device 1 may include a substrate SUB, a buffer layer BF, a first active layer ACTL1, a first gate insulating film GI1, a first gate layer GTL1, a first inter-insulating film ILD1, a second gate layer GTL2, a second inter-insulating film ILD2, a second active layer ACTL2, a second gate insulating film GI2, a third gate layer GTL3, a third inter-insulating film ILD3, a first source-drain layer SD1, a first via-layer (also referred to as a first insulating layer) VIA1, and a second source-drain layer (also referred to as a first conductive layer) SD2.

The substrate SUB may be a base substrate, and may include an insulating material such as a polymer resin. In an embodiment, the substrate SUB may be a flexible substrate capable of bending, folding, rolling, or the like, for example.

The buffer layer BF may be disposed on the substrate SUB. The buffer layer BF may be disposed on the entire upper surface of the substrate SUB in order to block moisture penetrating into the light emitting element EL through the substrate SUB. In an embodiment, the buffer layer BF may include a plurality of inorganic layers, for example.

The first active layer ACTL1 may be disposed on the buffer layer BF. The first active layer ACTL1 may include a silicon-based material. In an embodiment, the first active layer ACTL1 may include LTPS, for example. The first active layer ACTL1 may include active areas DT_ACT, ACT3, ACT4, ACT5, and ACT6, first electrodes DT_S, S3, S4, S5, and S6, and second electrodes DT_D, D3, D4, D5, and D6 of the driving transistor DT and the third to sixth transistors ST3, ST4, ST5, and ST6, respectively.

The first gate insulating film GI1 may be disposed on the first active layer ACTL1. The first gate insulating film GI1 may cover the buffer layer BF and the first active layer ACTL1. The first gate insulating film GI1 may insulate the first active layer ACTL1 from the first gate layer GTL1 to be described below.

The first gate layer GTL1 may be disposed on the first gate insulating film GI1. The first gate layer GTL1 may include a gate electrode DT_G of the driving transistor DT, a second scan line SLb, and an emission control line EML.

A part of the gate electrode DT_G of the driving transistor DT overlaps with the second electrode CE12 of the first capacitor C1 disposed on the second gate layer GTL2 to form the first electrode CE11 of the first capacitor C1.

A part of the second scan line SLb may overlap with the active area ACT3 of the third transistor ST3 to form the gate electrode G3 of the third transistor ST3. The other part of the second scan line SLb may overlap with the active area ACT6 of the sixth transistor ST6 to form the gate electrode G6 of the sixth transistor ST6.

A part of the emission control line EML may overlap with the active area ACT4 of the fourth transistor ST4 to form the gate electrode G4 of the fourth transistor ST4. The other part of the emission control line EML may overlap with the active area ACT5 of the fifth transistor ST5 to form the gate electrode G5 of the fifth transistor ST5.

The first inter-insulating film ILD1 may cover the first gate layer GTL1 and the first gate insulating film GI1. The first inter-insulating film ILD1 may insulate the first gate layer GTL1 and the second gate layer GTL2 from each other.

The second gate layer GTL2 may be disposed on the first inter-insulating film ILD1. The second gate layer GTL2 may include first and second metal layers BML1 and BML2, and a second electrode CE12 of the first capacitor C1. The first metal layer BML1 overlaps with the first transistor ST1 in a thickness direction to block light incident to the first transistor ST1. The second metal layer BML2 overlaps with the second transistor ST2 in a thickness direction to block light incident to the second transistor ST2. Each of the first and second metal layers BML1 and BML2 blocks light incident to each of the first and second transistors ST1 and ST2, thereby improving the turn-on property of the transistor. The second electrode CE12 of the first capacitor C1 may overlap with the first electrode CE11 disposed on the first gate layer GTL1.

The second inter-insulating film ILD2 may cover the second gate layer GTL2 and the first inter-insulating film ILD1. The second inter-insulating film ILD2 may insulate the second gate layer GTL2 and the second active layer ACTL2 from each other.

The second active layer ACTL2 may be disposed on the second inter-insulating film ILD2. In an embodiment, the second active layer ACTL2 may include an oxide-based material, for example. The second active layer ACTL2 may include active areas ACT1 and ACT2, second electrodes D1 and D2, and first electrodes S1 and S2 of the first and second transistors ST1 and ST2, respectively. The second gate insulating film GI2 may cover the second inter-insulating film ILD2 and the second active layer ACTL2, and insulate the second active layer ACTL2 and the third gate layer GTL3 from each other.

The third gate layer GTL3 may be disposed on the second gate insulating film GI2. The third gate layer GTL3 may include a first scan line SLa and a third scan line SLc. A part of the first scan line SLa may overlap with the active area ACT1 of the first transistor ST1 to form the gate electrode G1 of the first transistor ST1. A part of the third scan line SLc may overlap with the active area ACT2 of the second transistor ST2 to form the gate electrode G2 of the second transistor ST2.

The third inter-insulating film ILD3 may be disposed on the third gate layer GTL3. The third inter-insulating film ILD3 may cover the third gate layer GTL3 and the second gate insulating film GI2. The third inter-insulating film ILD3 may insulate the third gate layer GTL3 and the first source-drain layer SD1 from each other.

The first source-drain layer SD1 may be disposed on the third inter-insulating film ILD3. The first source-drain layer SD1 may include first to fourth connection electrodes BE1, BE2, BE3, and BE4, a driving voltage line VDDL, a first anode connection electrode ANDE1, and an initialization voltage line VIL.

The first connection electrode BE1 may be connected to the gate electrode DT_G of the driving transistor DT through the first contact hole CNT1, and may be connected to the first electrode S1 of the first transistor ST1 and the first electrode S2 of the second transistor ST2 through the second contact hole CNT2.

The second connection electrode BE2 may be connected to the second electrode D2 of the second transistor ST2 through the seventh contact hole CNT7, and may be connected to the second electrode DT_D of the driving transistor DT and the first electrode S5 of the fifth transistor ST5 through the eighth contact hole CNT8.

The third connection electrode BE3 may be connected to the first electrode S3 of the third transistor ST3 through the third contact hole CNT3. In addition, the third connection electrode BE3 may be connected to the data line DL.

The fourth connection electrode BE4 may be connected to the first metal layer BML1 through a fifteenth contact hole CNT15. Further, the fourth connection electrode BE4 may be connected to the second electrode D1 of the first transistor ST1.

The driving voltage line VDDL may be connected to the second electrode CE12 of the first capacitor C1 through the fourth contact hole CNT4, and may be connected to the first electrode S4 of the fourth transistor ST4 through the ninth contact hole CNT9.

The first anode connection electrode ANDE1 may be connected to the second electrode D5 of the fifth transistor ST5 and the second electrode D6 of the sixth transistor CNT5 through the fifth contact hole CNT5. In addition, the first anode connection electrode ANDE1 may be connected to the second anode connection electrode ANDE2 through the fourteenth contact hole CNT14, and the second anode connection electrode ANDE2 may be connected to the anode electrode of the light emitting element EL.

The initialization voltage line VIL may be connected to the second electrode D1 of the first transistor ST1 through the sixth contact hole CNT6, and may be connected to the first electrode S6 of the sixth transistor ST6 through the tenth contact hole CNT10.

The first via-layer VIA1 may be disposed on the first source-drain layer SD1. The first via-layer VIA1 may cover the first source-drain layer SD1 and the third inter-insulating film ILD3. The first via-layer VIA1 may insulate the first source-drain layer SD1 and the second source-drain layer SD2 from each other. The upper surface of the first via-layer VIA1 may be substantially flat.

The second source-drain layer SD2 may be disposed on the first via-layer VIA1. The second source-drain layer SD2 may include a light blocking portion BL, a data line DL, and a second anode connection electrode ANDE2 which are separated from each other.

The light blocking portion BL may be connected to the second electrode D5 of the fifth transistor ST5 and the second electrode D6 of the sixth transistor ST6 through a twelfth contact hole CNT12. The light blocking portion (also referred to as a first light blocking pattern) BL has an island-like pattern and may be a floating electrode.

The data line DL may be connected to the first electrode S3 of the third transistor ST3 through the third contact hole CNT3. A plurality of data lines (also referred to as second and third light blocking patterns) DL is included, and each of the data lines DL may be a linear pattern having a shape extending in parallel in a second direction Y (refer to FIGS. 1 and 2). Each data line DL may be disposed adjacent to each other, but is not limited thereto.

The second anode connection electrode ANDE2 may be connected to the first anode connection electrode ANDE1 through the fourteenth contact hole CNT14. Although described below, the second anode connection electrode ANDE2 may be connected to a sub-pixel electrode through the twelfth contact hole CNT12.

The width of the light blocking portion BL in the first direction X (refer to FIGS. 1 and 2) is greater than the width of the data line DL in the first direction X, and may be greater than the width of the second anode connection electrode ANDE2 in the first direction X. The width of the light blocking portion BL in the first direction X may be greater than the sum of the width of the data line DL in the first direction X and the width of the second anode connection electrode ANDE2 in the first direction X.

Figure 7:
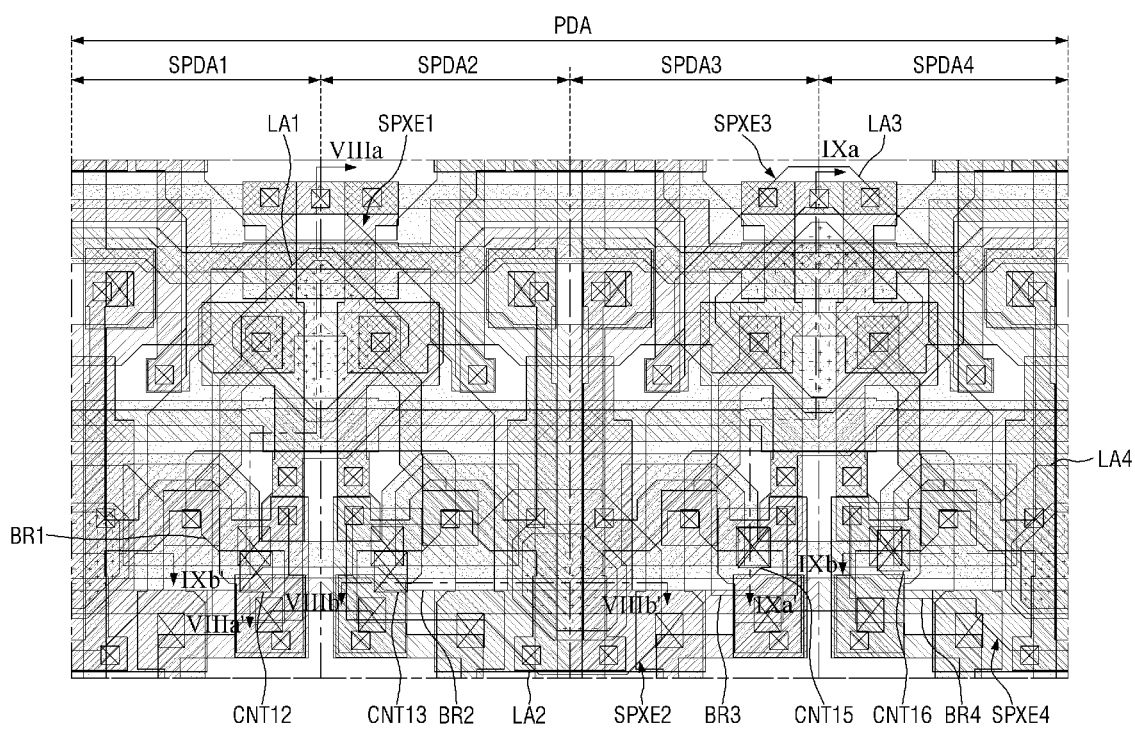
FIG. 7 is a plan view illustrating an embodiment of a pixel of the display device.

FIG. 7 is a plan view illustrating an embodiment of a pixel of the display device.

Referring to FIG. 7, the display device 1 in an embodiment may include a pixel driver and a pixel electrode disposed on the pixel driver. The pixel driver PDA may drive the pixel electrode.

The pixel driver PDA in an embodiment may include first to fourth sub-pixel drivers SPDA1 to SPDA4. The first to fourth sub-pixel drivers SPDA1 to SPDA4 may be arranged sequentially in a first direction. The planar shape of the first sub-pixel driver SPDA1 may be the same as that of the sub-pixel driver described above with reference to FIG. 4. The second sub-pixel driver SPDA2 may have a planar shape symmetrical with respect to an edge of the first sub-pixel driver SPDA1 in the first direction. The third sub-pixel driver SPDA3 may have the same planar shape as that of the first sub-pixel driver SPDA1, and the fourth sub-pixel driver SPDA4 may have the same planar shape as that of the second sub-pixel driver SPDA2.

The pixel electrode may be disposed on the pixel driver. The pixel electrode in an embodiment may include first to fourth sub-pixel electrodes SPXE1 to SPXE4.

The first sub-pixel electrode SPXE1 may be disposed across the first sub-pixel driver SPDA1 and the second sub-pixel driver SPDA2. The second sub-pixel electrode SPXE2 may be disposed across the second sub-pixel driver SPDA2 and the third sub-pixel driver SPDA3. The third sub-pixel electrode SPXE3 may be disposed across the third sub-pixel driver SPDA3 and the fourth sub-pixel driver SPDA4. The fourth sub-pixel electrode SPXE4 may be disposed across a first pixel driver of a pixel adjacent to the fourth sub-pixel driver SPDA4.

The first sub-pixel electrode SPXE1 may include a first light emitting portion LA1 having a rhombic shape and a first branch portion BR1 extending from the first light emitting portion LA1 to the other side in a second direction. The first light emitting portion LA1 may be disposed in the light blocking portion BL. However, the invention is not limited thereto, and the first sub-pixel electrode SPXE1 may be disposed in the light blocking portion BL in the plan view. The other half of the first light emitting portion LA1 in the first direction may overlap with the first sub-pixel driver SPDA1, and one half of the first light emitting portion LA1 in the first direction may overlap with the second sub-pixel driver SPDA2. The first branch portion BR1 may be connected to the second anode connection electrode of the first sub-pixel driver SPDA1 through the twelfth contact hole CNT12. The first light emitting portion LA1 may overlap with the light blocking portion of the first sub-pixel driver SPDA1 and the light blocking portion of the second sub-pixel driver SPDA2.

The second sub-pixel electrode SPXE2 may be disposed on one side of the first sub-pixel electrode SPXE1 in the first direction. The second sub-pixel electrode SPXE2 may include a second light emitting portion LA2 having a hexagonal shape and a second branch portion BR2 extending from the second light emitting portion LA2 to the other side in the first direction. The second light emitting portion LA2 may be disposed at a lower right side from the first light emitting portion LA1 in the plan view. The other half of the second light emitting portion LA2 in the first direction may overlap with the second pixel driver, and one half of the second light emitting portion LA2 in the first direction may overlap with the third sub-pixel driver SPDA3. The second branch portion BR2 may be connected to the second anode connection electrode of the second sub-pixel driver SPDA2 through a thirteenth contact hole CNT13. The second light emitting portion LA2 of the second sub-pixel electrode SPXE2 may partially overlap with the data line of the second sub-pixel driver SPDA2 and the data line of the third sub-pixel driver SPDA3.

The third sub-pixel electrode SPXE3 may be disposed on one side of the second sub-pixel electrode SPXE2 in the first direction. The second sub-pixel electrode SPXE2 may be disposed on one side of the first sub-pixel electrode SPXE1 in the first direction. The third sub-pixel electrode SPXE3 may include a third light emitting portion LA3 having a rhombic shape and a third branch portion BR3 extending from the third light emitting portion LA3 to the other side in the second direction. The third light emitting portion LA3 may be disposed at an upper right side from the second light emitting portion LA2 in the plan view. The other half of the third light emitting portion LA3 in the first direction may overlap with the third pixel driver, and one half of the third light emitting portion LA3 in the first direction may overlap with the fourth sub-pixel driver SPDA4. The third light emitting portion LA3 may have a larger area than that of the first light emitting portion LA1. The third branch portion BR3 may be connected to the second anode connection electrode of the third sub-pixel driver SPDA3 through the fifteenth contact hole CNT15. The third light emitting portion LA3 may overlap with the light blocking portion of the third sub-pixel driving unit SPDA3 and the light blocking portion of the fourth sub-pixel driving unit SPDA4.

The fourth sub-pixel electrode SPXE4 may be disposed on one side of the third sub-pixel electrode SPXE3 in the first direction. The fourth sub-pixel electrode SPXE4 may include a fourth light emitting portion LA4 having a hexagonal shape and a fourth branch portion BR4 extending from the fourth light emitting portion LA4 to the other side in the first direction. The fourth light emitting portion LA4 may be disposed at a lower right side from the third light emitting portion LA3 in the plan view. The other half of the fourth light emitting portion LA4 in the first direction may overlap with the fourth pixel driver, and one half of the fourth light emitting portion LA4 in the first direction may overlap with the first sub-pixel driver SPDA1 of a neighboring pixel. The fourth light emitting portion LA4 may have the same area as that of the second light emitting portion LA2. The fourth light emitting portion LA4 may have a left-right symmetric relationship with the second light emitting portion LA2. The fourth branch portion BR4 may be connected to the second anode connection electrode of the fourth sub-pixel driver SPDA4 through the sixteenth contact hole CNT16. The fourth light emitting portion LA4 of the fourth sub-pixel electrode SPXE4 may partially overlap with the data line of the fourth sub-pixel driver SPDA4 and the data line of the first sub-pixel driver SPDA1 of a neighboring pixel.

The width of the first sub-pixel electrode SPXE1 in the first direction X (refer to FIGS. 1 and 2) may be greater than the width of the second sub-pixel electrode SPXE2 in the second direction Y (refer to FIGS. 1 and 2). The width of the third sub-pixel electrode SPXE3 in the first direction X may be greater than the width of the fourth sub-pixel electrode SPXE4 in the second direction Y.

Figure 8:
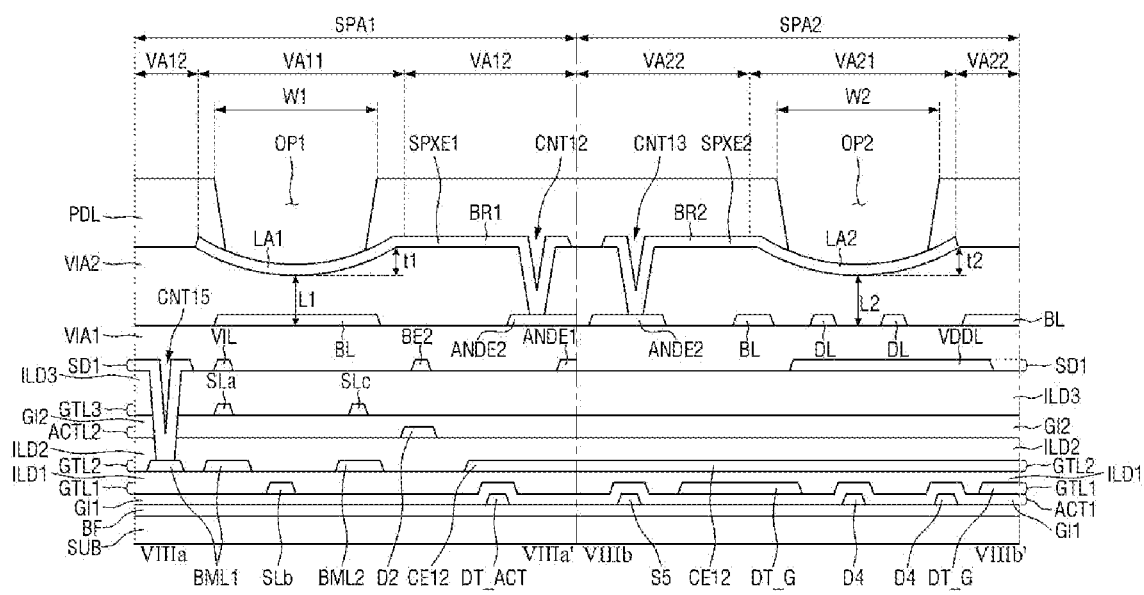
FIG. 8 is a cross-sectional view taken along lines VIIIa-VIIIa' and VIIIb-VIIIb' of FIG. 7.

FIG. 8 is a cross-sectional view taken along lines VIIIa-VIIIa' and VIIIb-VIIIb' of FIG. 7. Although FIG. 8 is a cross-sectional view taken along lines VIIIa-VIIIa' and VIIIb-VIIIb' of FIG. 7, as described above, the third sub-pixel driver SPDA3 has the same shape as that of the first sub-pixel driver SPDA1, and the fourth sub-pixel driver SPDA4 has the same shape as that of the second sub-pixel driver SPDA2. In addition, the planar shape of the third sub-pixel electrode SPXE3 is similar to that of the first sub-pixel electrode SPXE1 and the planar shape of the fourth sub-pixel electrode SPXE4 is similar to that of the second sub-pixel electrode SPXE2. Accordingly, a cross-sectional view of FIG. 7 taken along lines IXa-IXa' and IXb-IXb' may also have the same cross-sectional structure.

Referring to FIG. 8, in the first sub-pixel driver (also referred to as a first sub-pixel driving area) SPDA1 taken along line VIIIa-VIIIa' of FIG. 7, the active area DT_ACT of the driving transistor DT of the first active layer ACTL1 may partially overlap with the second electrode CE12 of the first capacitor C1, and may particularly overlap with the second anode connection electrode ANDE2 and the first sub-pixel electrode SPXE1.

The second scan line SLb of the first gate layer GTL1 may partially overlap with the light blocking portion BL of the second source-drain layer SD2 and the first sub-pixel electrode SPXE1.

The first metal layer BML1 of the second gate layer GTL2 may partially overlap with the first scan line SLa of the third gate layer GTL3, the initialization voltage line VIL of the first source-drain layer SD1, the light blocking portion BL of the source-drain layer SD2 (refer to FIG. 5), and the first sub-pixel electrode SPXE1. Further, the first metal layer BML1 may be connected to the fourth connection electrode BE4 through the fifteenth contact hole CNT15. The second metal layer BML2 of the second gate layer GTL2 may partially overlap with the third scan line SLc of the third gate layer GTL3, the light blocking portion BL of the second source-drain layer SD2, and the first sub-pixel electrode SPXE1.

The second electrode D2 of the second transistor ST2 of the second active layer ACTL2 may partially overlap with the second connection electrode BE2 of the first source-drain layer SD1, the light blocking portion BL of the second source-drain layer SD2, and the first sub-pixel electrode SPXE1.

The first scan line SLa of the third gate layer GTL3 may partially overlap with the initialization voltage line VIL of the first source-drain layer SD1, the light blocking portion BL of the second source-drain layer SD2, and the first sub-pixel electrode SPXE1. The third scan line SLc of the third gate layer GTL3 may partially overlap with the light blocking portion BL of the second source-drain layer SD2 and the first sub-pixel electrode SPXE1.

The fourth connection electrode BE4 (refer to FIG. 6) of the first source-drain layer SD1 may be connected to the first metal layer BML1 of the second gate layer GTL2 through the fifteenth contact hole CNT15. The initialization voltage line VIL of the first source-drain layer SD1 may partially overlap with the light blocking portion BL of the second source-drain layer SD2 and the first sub-pixel electrode SPXE1. The second connection electrode BE2 of the first source-drain layer SD1 may partially overlap with the first sub-pixel electrode SPXE1. The first anode connection electrode ANDE1 of the first source-drain layer SD1 may partially overlap with the second anode connection electrode ANDE2 of the second source-drain layer SD2 and the first sub-pixel electrode SPXE1.

The light blocking portion BL of the second source-drain layer SD2 may overlap with the first sub-pixel electrode SPXE1. The second anode connection electrode ANDE2 of the second source-drain layer SD2 may overlap with the first sub-pixel electrode SPXE1.

The second via-layer (also referred to as a second insulating layer) VIA2 may be disposed on the second source-drain layer SD2. The first sub-pixel electrode SPXE1 may be disposed on the second via-layer VIA2. In the first sub-pixel driver SPDA1, the second via-layer VIA2 may include a first emission area VA11 overlapping with the first light emitting portion LA1 of the first sub-pixel electrode SPXE1, and a first non-emission area VA12 overlapping with the first branch portion BR1. The upper surface of the central portion of the first emission area VA11 of the second via-layer VIA2 may include a curved surface concave downward, and the upper surface of the first non-emission area VA12 may be flat. The concave upper surface may mean that the height decreases toward the center. The upper surface of the first light emitting portion LA1 may have the same concave shape as that of the upper surface of the first emission area VA11.

The first emission area VA11 may overlap with the light blocking portion BL of the second source-drain layer SD2 disposed below. The first emission area VA11 may have a first width W1. The upper surface of the first emission area VA11 may be spaced apart from the upper surface of the first via-layer VIA1 by a first separation distance L1. The first separation distance L1 may decrease toward the central portion of the first emission area VA11. The lowest point of the upper surface of the first emission area VA11 and the upper surface of the first non-emission area VA12 may have a height difference of a first depth t1.

A pixel defining layer PDL may be disposed on the first sub-pixel electrode SPXE1. The pixel defining layer PDL may cover the first sub-pixel electrode SPXE1 and the second via-layer VIA2. The pixel defining layer PDL may be entirely disposed on the second via-layer VIA2. A first opening OP1 partially exposing the first light emitting portion LA1 of the first sub-pixel electrode SPXE1 may be defined in the pixel defining layer PDL.

In the second sub-pixel driver SPDA2 taken along line VIIIb-VIIIb' of FIG. 7, the first electrode S5 of the fifth transistor ST5 of the first active layer ACTL1 may be partially overlap with the second anode connection electrode ANDE2 of the second source-drain layer SD2 and the second sub-pixel electrode SPXE2. The second electrode D4 of the fourth transistor ST4 of the first active layer ACTL1 may partially overlap with the driving voltage line VDDL of the first source-drain layer SD1, the data line DL of the second source-drain layer SD2, and the second sub-pixel electrode SPXE2.

The gate electrode DT_G of the driving transistor DT of the first gate layer GTL1 may partially overlap with the driving voltage line VDDL of the first source-drain layer SD1, the second anode connection electrode ANDE2 and the light blocking portion BL of the second source-drain layer SD2, and the second sub-pixel electrode SPXE2.

The driving voltage line VDDL of the first source-drain layer SD1 may partially overlap with the light blocking portion BL and the data line DL of the second source-drain layer SD2 and the second sub-pixel electrode SPXE2.

The second anode connection electrode ANDE2, the light blocking portion BL and the data line DL of the second source-drain layer SD2 may partially overlap with the second sub-pixel electrode SPXE2.

The second via-layer VIA2 may be disposed on the second source-drain layer SD2. The second sub-pixel electrode SPXE2 may be disposed on the second via-layer VIA2. In the second sub-pixel driver (also referred to as a second sub-pixel driving area) SPDA2, the second via-layer VIA2 may include a second emission area VA21 overlapping with the second light emitting portion LA2 of the second sub-pixel electrode SPXE2, and a second non-emission area VA22 overlapping with the second branch portion BR2. The upper surface of the central portion of the second emission area VA21 of the second via-layer VIA2 is concave downward, and the upper surface of the second non-emission area VA22 may be flat. The concave upper surface may mean that the height decreases toward the central portion. The upper surface of the second light emitting portion LA2 may have the same concave shape as that of the upper surface of the second emission area VA21.

The second emission area VA21 may overlap with the light blocking portion BL of the second source-drain layer SD2 disposed below. The second emission area VA21 may have a second width W2. The second width W2 may be smaller than the first width W1. The upper surface of the second emission area VA21 may be spaced apart from the upper surface of the first via-layer VIA1 by a second separation distance L2. The second separation distance L2 may decrease toward the central portion of the second emission area VA21. The lowest point of the upper surface of the second emission area VA21 and the upper surface of the second non-emission area VA22 may have a height difference of a second depth t2. The second depth t2 may be greater than the first depth t1 described above.

The second emission area VA21 may have a shape similar to that of the first emission area VA11. The upper surfaces of the first light emitting portion LA1 disposed on the first emission area VA11 and the second light emitting portion LA2 disposed on the second emission area VA21 may have the same shape.

When external light is irradiated from the outside of the display device 1, the external light may be reflected by the first and second sub-pixel electrodes SPXE1 and SPXE2 to be visually recognized. The external light may be mainly reflected by the first light emitting portion LA1 and the second light emitting portion LA2 occupying a main area in the first and second sub-pixel electrodes SPXE1 and SPXE2. Accordingly, each of the upper surfaces of the first and second light emitting portions LA1 and LA2 may have a concave structure, so that first and second sub-pixel electrodes SPXE1 and SPXE2 may have the same optical properties, respectively. As described above, the description of the first and second sub-pixels SP1 and SP2 may be equally applied even to the third and fourth sub-pixels SP3 and SP4.

A pixel defining layer PDL may be disposed on the second sub-pixel electrode SPXE2. The pixel defining layer PDL may cover the second sub-pixel electrode SPXE2 and the second via-layer VIA2. A second opening OP2 partially exposing the second light emitting portion LA2 of the second sub-pixel electrode SPXE2 may be further defined in the pixel defining layer PDL.

According to the display device 1 in an embodiment, the first to fourth sub-pixels SP1, SP2, SP3, and SP4 may include sub-pixel electrodes having the same upper surface shape to exhibit the same optical properties with respect to external light irradiated from the outside. That is, the external light irradiated from the outside may be reflected in the same pattern for each sub-pixel electrode. Accordingly, even when light is irradiated from the outside, it is possible to prevent the light leakage of a predetermined color from being visually recognized.

FIGS. 9 to 13 are schematic views illustrating an embodiment of a method of manufacturing a display device. In the schematic views of FIGS. 9 to 13, a part of a stacked structure is omitted, but the stacked structure is the same as the stacked structures of the substrate SUB to the first via-layer VIA1 illustrated in FIG. 8.

Figure 9:
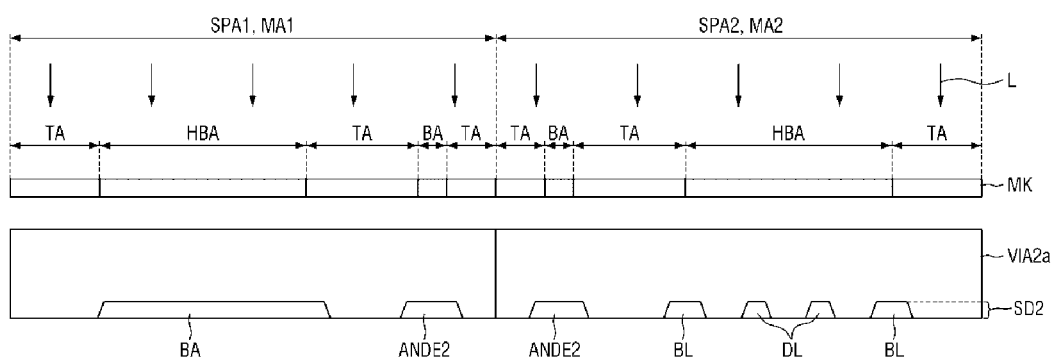
FIGS. 9 to 13 are schematic views illustrating an embodiment of a method of manufacturing a display device.

Referring to FIG. 9, the second source-drain layer SD2 including the light blocking portion BL, the data line DL, and the second anode connection electrode ANDE2 which are separated from each other is disposed on the substrate (refer to 'SUB' in FIG. 8), a second via-material layer (also referred to as an insulating-material layer) VIA2a is coated on the second source-drain layer SD2, and then a mask MK is disposed on the second via-material layer VIA2a to irradiate light L.

A first mask area MA1 is disposed in the first sub-pixel area SPA1. The first mask area MA1 includes a light transmitting area TA, a light blocking area BA, and a semi-light blocking area HBA. The semi-light blocking area HBA is disposed in an area overlapping with the light blocking portion BL, the light blocking area BA is disposed in an area overlapping with the second anode connection electrode ANDE2, and the light transmitting area TA is disposed in other area. Here, the width of the semi-light blocking area HBA may be smaller than the width of the light blocking portion BL, and the width of the light blocking portion BL may be smaller than the width of the second anode connection electrode ANDE2.

A second mask area MA2 is disposed in the second sub-pixel area SPA2. The second mask area MA2 includes a light transmitting area TA, a light blocking area BA, and a semi-light blocking area HBA, the light blocking area BA is disposed in an area overlapping the second anode connection electrode ANDE2, the semi-light blocking area HBA is disposed in an area overlapping with the data line DL, and the light transmitting area TA is disposed in the other area. Here, the width of the light blocking area BA may be smaller than the width of the second anode connection electrode ANDE2. The semi-light blocking area HBA may cover the entire data line DL disposed below and may cover a part of the light blocking portion BL, but is not limited thereto and may cover the entire light blocking portion BL.

Figure 10:
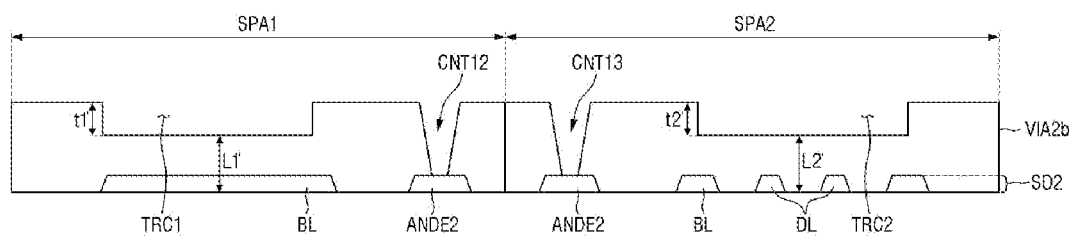

Referring to FIG. 10, the second via-material layer VIA2a irradiated with light is developed using a developer. As a result, a second via-pattern VIA2b including a first trench TRC1, a second trench TRC2, a twelfth contact hole CNT12, and a thirteenth contact hole CNT13 may be defined. The second via-pattern VIA2b may be defined by partially removing the upper surface of the second via-material layer VIA2a.

In the second via-pattern VIA2b, a thickness of an area in which the first trench TRC1 and the second trench TRC2 are disposed may be smaller than the thickness of other area. The first trench TRC1 and the second trench TRC2 may have a quadrangular (e.g., rectangular) parallelepiped internal structure.

The first trench TRC1 may have a trench structure having a maximum width of a first' width W1' and a maximum depth of a first' depth t1'. The lower surface of the first trench TRC1 and the bottom surface of the second via-pattern VIA2b overlapping therewith may be spaced apart from each other by a first' separation distance L1'.

The second trench TRC2 may have a trench structure having a maximum width of a second' width W2' and a maximum depth of a second' depth t2'. The lower surface of the first trench TRC1 and the bottom surface of the second via-pattern VIA2b overlapping therewith may be spaced apart from each other by a second' separation distance L2'.

The first trench TRC1 may not expose the light blocking portion BL disposed below. The second trench TRC2 may not expose the light blocking portion BL and the data line DL disposed below.

In the second via-pattern VIA2b, the twelfth contact hole CNT12 and the thirteenth contact hole CNT13 may expose the second anode connection electrode ANDE2.

Figure 11:
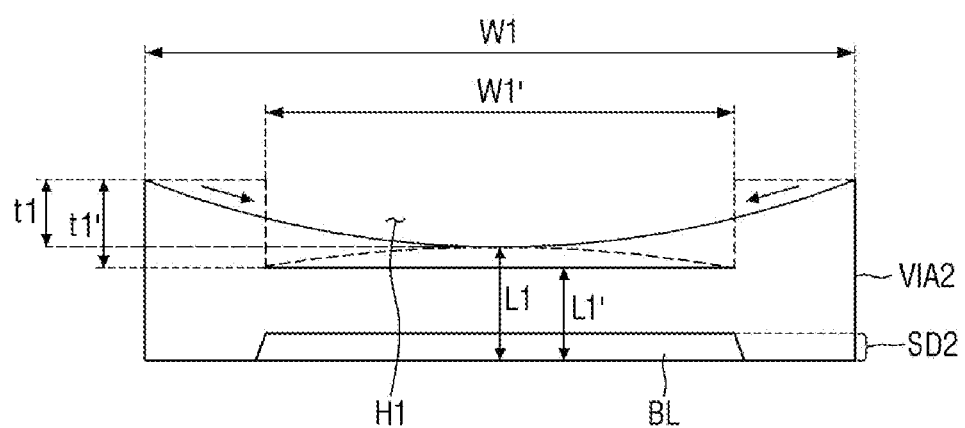
Figure 12:
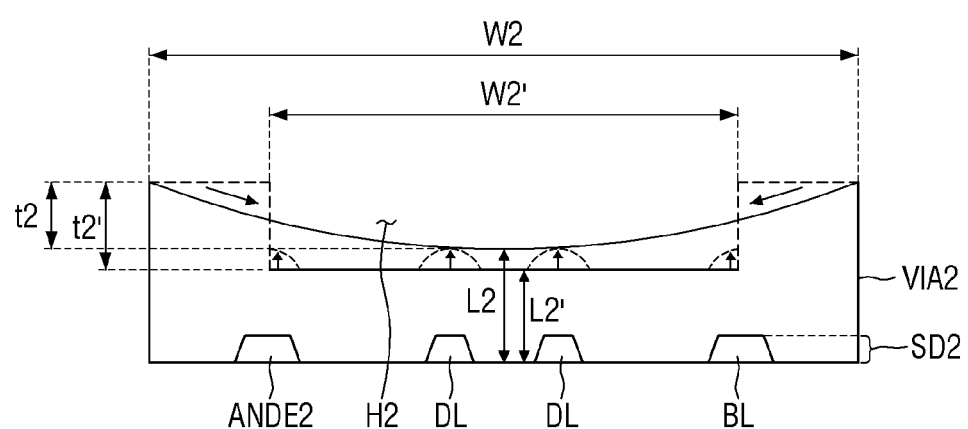
Figure 13:
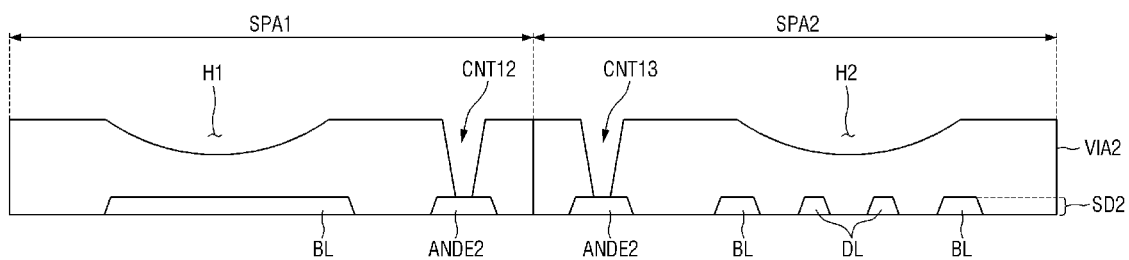

Referring to FIGS. 11 to 13, the second via-pattern VIA2b including the first trench TRC1, the second trench TRC2, the twelfth contact hole CNT12, and the thirteenth contact hole CNT13 may be heat-treated. As a result, a first groove H1 and a second groove H2 may be defined in a second via-layer VIA2. Central portions of the first and second grooves H1 and H2 may include curved surfaces having predetermined curvatures.

The first groove H1 may be defined by deforming the first trench TRC1. A material constituting the inner wall of the first trench TRC1 flows down by heat to define the first groove H1 having the maximum width of the first width W1 greater than the first' width W1' of the first trench TRC1 and the maximum depth of the first depth t1 smaller than the first' depth t1' of the first trench TRC1. The maximum depth of the first groove H1 may be defined in the central portion. In this case, a force to protrude upward may be applied to an area of the second via-pattern VIA2b overlapping therewith by the light blocking portion BL disposed below. Accordingly, the lower surface of the first groove H1 and the bottom surface of the second via-pattern VIA2b overlapping therewith may be spaced apart from each other by the first separation distance L1 greater than the first' separation distance L1'.

The second groove H2 may be defined by deforming the second trench TRC2. A material constituting the inner wall of the second trench TRC2 flows down to define the second groove H2 having the maximum width of the second width W2 greater than the second' width W2' of the second trench TRC2 and the maximum depth of the second depth t2 smaller than the second' depth t2' of the second trench TRC2. The maximum depth of the second groove H2 may be defined in the central portion. In this case, a force to protrude upward may be applied to an area of the second via-pattern VIA2b overlapping therewith by the light blocking portion BL and the data line DL disposed below. Accordingly, the lower surface of the second groove H2 and the bottom surface of the second via-pattern VIA2b overlapping therewith may be spaced apart from each other by the second separation distance L2 greater than the second' separation distance L2'.

The flatness of the central portions of the first and second grooves H1 and H2 may be lower than the flatness of the central portions of the first and second trenches TRC1 and TRC2. The flatness may be defined as a standard deviation of heights for each area on one side. The central portions of the first and second trenches TRC1 and TRC2 may be substantially flat.

In a subsequent process, on the second via-layer VIA2 overlapping with the first and second grooves H1 and H2, the first and second light emitting portions LA1 and LA2 of the first and second sub-pixel electrodes SPXE1 and SPXE2 may be disposed, respectively. When external light is irradiated from the outside of the display device 1, the external light may be reflected by the first and second sub-pixel electrodes SPXE1 and SPXE2 to be visually recognized. The external light may be mainly reflected by the first light emitting portion LA1 and the second light emitting portion LA2 occupying a main area in the first and second sub-pixel electrodes SPXE1 and SPXE2. Accordingly, each of the upper surfaces of the first and second light emitting portions LA1 and LA2 may have a concave planar structure, so that first and second sub-pixel electrodes SPXE1 and SPXE2 may have the same optical properties, respectively.

Hereinafter, another embodiment of the display device 1 will be described. In the description of the display device 1 according to another embodiment to be described below, the duplicated description with the display device 1 in the embodiment will be omitted, and differences will be mainly described.

Figure 14:
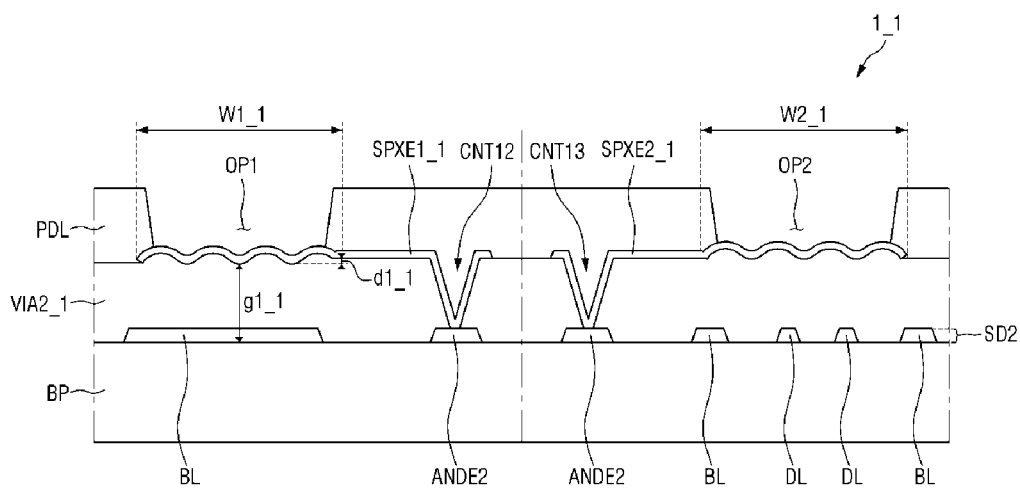
FIG. 14 is a cross-sectional view of an embodiment of a display device.

FIG. 14 is a cross-sectional view of another embodiment of a display device.

Referring to FIG. 14, an upper surface of a second via-layer VIA2_1 included in a display device 1_1 in the embodiment may have a curved shape including a plurality of protrusions and recessions in an area overlapping with first and second openings OP1 and OP2. First and second sub-pixel electrodes SPXE1_1 and SPXE2_1 may be disposed on the second via-layer VIA2_1. Specifically, the upper surfaces of the first and second sub-pixel electrodes SPXE1_1 and SPXE2_1 may have a curved shape including a plurality of protrusions and recessions in response to the upper surface of the second via-layer VIA2_1 overlapping therewith. In an embodiment, a trench structure of the display device 1_1 may have a maximum width of a first' width W1_1 and a maximum depth of a first' depth d1_1. The lower surface of the trench structure and the bottom surface of the second via-layer VIA2_1 may be spaced apart from each other by a separation distance g1_1.

According to the display device 1_1 in the embodiment, the first and second sub-pixels SP1 and SP2 may include the first and second sub-pixel electrodes SPXE1_1 and SPXE2_1 having the same upper surface shape to exhibit the same optical properties with respect to external light irradiated from the outside. That is, the external light irradiated from the outside may be reflected in the same pattern for each of the sub-pixel electrodes SPXE1_1 and SPXE2_1. Accordingly, even when the light is irradiated from the outside, it is possible to prevent the light leakage of a predetermined color from being visually recognized.

According to the display device in the embodiment, it is possible to exhibit the same optical properties for each sub-pixel with respect to external light introduced from the outside by including a sub-pixel electrode having the same upper surface shape for each pixel.

According to the method of manufacturing the display device in the embodiment, it is possible to provide a display device which exhibits the same optical properties for each sub-pixel with respect to external light introduced from the outside by including a sub-pixel electrode having the same upper surface shape for each pixel.

Therefore, it is possible to prevent the occurrence of light leakage of a predetermined color due to excessive reflection of external light in a predetermined direction by the sub-pixel electrode.

The effects of the embodiments are not limited by the foregoing, and other various effects are anticipated herein.

Although the preferred embodiments of the invention have been disclosed for illustrative purposes, those skilled in the art will appreciate that various modifications, additions and substitutions are possible, without departing from the scope and spirit of the invention.

In concluding the detailed description, those skilled in the art will appreciate that many variations and modifications may be made to the preferred embodiments without substantially departing from the principles of the invention. Therefore, the disclosed preferred embodiments of the invention are used in a generic and descriptive sense only and not for purposes of limitation.

What is claimed is:

1. A display device, comprising:

a substrate;

a first insulating layer disposed on the substrate and including a first surface facing the substrate and a second surface which is opposite to the first surface and flat;

a first conductive layer disposed on the substrate, the first conductive layer including a first light blocking pattern, a second light blocking pattern, and a third light blocking pattern which are separated from each other;

a second insulating layer disposed on the first conductive layer, the second insulating layer including first and second areas each including a first surface which faces the substrate and a second surface which is opposite to the first surface; and a plurality of pixel electrodes disposed on the second insulating layer, the plurality of pixel electrodes including:

a first pixel electrode which is disposed in a first color pixel and overlaps the first light blocking pattern in a plan view, and a second pixel electrode which is disposed in a second color pixel and covers the second light blocking pattern and the third light blocking pattern in a first direction, wherein the first area of second insulating layer overlaps with the first pixel electrode and a second area of second insulating layer overlaps with the second pixel electrode, and each of the second surface of the first area and the second surface of the second area of the second insulating layer includes a curved surface with a concave central portion, wherein the second light blocking pattern and the third light blocking pattern are linear patterns extending in a second direction perpendicular to the first direction, respectively.

2. The display device of claim 1, wherein a minimum distance to the second surface of the first area of the second insulating layer measured from the second surface of the first insulating layer is smaller than a minimum distance to the second surface of the second area of the second insulating layer measured from the second surface of the first insulating layer.

3. The display device of claim 1, wherein a width of the first area in the first direction is greater than the width of the second area in the first direction.

4. The display device of claim 1, wherein each of the second surface of the first area and the second surface of the second area of the second insulating layer includes a plurality of protrusions and recessions at the concave central portion thereof.

5. The display device of claim 1, wherein the second insulating layer further includes a third area non-overlapping with the first pixel electrode and the second pixel electrode, wherein a height difference between the second surface of the third area and the second surface of the first area is smaller than a height difference between the second surface of the third area and the second surface of the second area.

6. The display device of claim 1,
wherein the distance to the second surface of the first area measured from the second surface of the first insulating layer decreases toward the concave central portion of the first area.

7. The display device of claim 6,
wherein the distance to the second surface of the second area measured from the second surface of the first insulating layer decreases toward the concave central portion of the second area.

8. The display device of claim 1,
wherein the first light blocking pattern is an island-like pattern.

9. The display device of claim 8,
wherein the first light blocking pattern is a floating electrode, and the first light blocking pattern and the second light blocking pattern are data lines, respectively.

10. The display device of claim 8,
wherein a width of the first light blocking pattern in the first direction is greater than a sum of a width of the second light blocking pattern in the first direction and a width of the third light blocking pattern in the first direction.

11. The display device of claim 8,
wherein the width of the first light blocking pattern in the first direction is greater than the width of the second light blocking pattern in the first direction and greater than the width of the third light blocking pattern in the first direction.

12. The display device of claim 8,
wherein a width of the first pixel electrode in the first direction is greater than a width of the second pixel electrode in the first direction.

13. A display device, comprising:
a substrate;
a first insulating layer disposed on the substrate and including a first surface facing the substrate and a second surface which is opposite to the first surface and flat;
a first conductive layer disposed on the substrate, the first conductive layer including a first light blocking pattern, a second light blocking pattern, and a third light blocking pattern which are separated from each other;
a second insulating layer disposed on the first conductive layer, the second insulating layer including first and second areas each including a first surface which faces the substrate and a second surface which is opposite to the first surface; and
a plurality of pixel electrodes disposed on the second insulating layer, the plurality of pixel electrodes including:
a first pixel electrode which is disposed in a first color pixel and overlaps the first light blocking pattern in a plan view, and
a second pixel electrode which is disposed in a second color pixel and covers the second light blocking pattern and the third light blocking pattern in a first direction,
wherein the first area of second insulating layer overlaps with the first pixel electrode and a second area of second insulating layer overlaps with the second pixel electrode, and
wherein each of the second surface of the first area and the second surface of the second area of the second insulating layer includes a curved surface with a concave central portion, wherein the display device further comprises:
a plurality of thin film transistors disposed between the substrate and the first insulating layer.

14. The display device of claim 13,
wherein the plurality of thin film transistors includes a first thin film transistor including a silicon-based semiconductor layer and a second thin film transistor including an oxide semiconductor layer.

15. The display device of claim 14,
wherein the oxide semiconductor layer is disposed on the silicon-based semiconductor layer.

16. A method of manufacturing a display device, the method comprising:
forming a first conductive layer including a first light blocking pattern, a second light blocking pattern, and a third light blocking pattern which are separated from each other, on a substrate;
coating an insulating-material layer on the first conductive layer;
disposing a mask including a light transmitting area, a light blocking area, and a semi-light blocking area on the insulating-material layer, and irradiating light onto the insulating-material layer through the mask;
developing the insulating-material layer to define an insulating pattern including a trench;
defining a groove in an insulating layer by heat-treating the insulating pattern; and
forming a pixel electrode on the groove of the insulating layer,
wherein a width of the groove is greater than a width of the trench.

17. The method of claim 16,
wherein a maximum depth of a central portion of the groove is smaller than a maximum depth of a central portion of the trench.

18. The method of claim 16,
wherein a flatness of a central portion of the groove is lower than a flatness of a central portion of the trench.

19. The method of claim 16,
wherein a central portion of the groove includes a curved surface having a predetermined curvature.

20. The method of claim 16,
wherein a central portion of the trench is flat.

* * * * *